United States Patent
Kang et al.

(12) United States Patent (10) Patent No.: US 7,320,913 B2
Kang et al. (45) Date of Patent: Jan. 22, 2008

(54) METHODS OF FORMING SPLIT-GATE NON-VOLATILE MEMORY DEVICES

(75) Inventors: Sung-Taeg Kang, Seoul (KR); Hyok-Ki Kwon, Yongin (KR); Bo Young Seo, Anyang-si (KR); Seung Beom Yoon, Suwon (KR); Hee Seog Jeon, Hwasung (KR); Yong-Suk Choi, Hwaseong (KR); Jeong-Uk Han, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 57 days.

(21) Appl. No.: 11/368,247

(22) Filed: Mar. 3, 2006

(65) Prior Publication Data

US 2006/0199336 A1 Sep. 7, 2006

(30) Foreign Application Priority Data

Mar. 7, 2005 (KR) .................... 10-2005-0018771

(51) Int. Cl.
*H01L 21/336* (2006.01)
(52) U.S. Cl. .................... 438/257; 438/261; 438/267; 438/593; 438/596
(58) Field of Classification Search ........ 438/257–258, 438/261, 266–267, 593, 596
See application file for complete search history.

(56) References Cited

U.S. PATENT DOCUMENTS

| 6,251,727 | B1 * | 6/2001 | Chen ........................... 438/257 |
| 6,274,436 | B1 * | 8/2001 | Kao et al. ................... 438/267 |
| 6,465,838 | B1 * | 10/2002 | Hsieh ......................... 257/316 |
| 7,214,589 | B2 * | 5/2007 | Liu et al. .................... 438/259 |
| 2002/0093044 | A1 * | 7/2002 | Hsieh et al. ................. 257/315 |
| 2003/0127684 | A1 * | 7/2003 | Yoo et al. .................... 257/316 |

FOREIGN PATENT DOCUMENTS

| JP | 20030124360 | 4/2003 |
| KR | 0142604 | 4/1998 |
| KR | 20010060548 | 7/2001 |

OTHER PUBLICATIONS

Korean Patent Abstract for 100142604.
Korean Patent Abstract for 10-2001-0060548.
Korean Patent Abstract for 2003-124360.

* cited by examiner

*Primary Examiner*—Zandra V. Smith
*Assistant Examiner*—Toniae M Thomas
(74) *Attorney, Agent, or Firm*—F. Chau & Associates, LLC.

(57) ABSTRACT

Non-volatile memory devices and methods for fabricating non-volatile memory devices are disclosed. More specifically, split gate memory devices are provided having frameworks that provide increased floating gate coupling ratios, thereby enabling enhanced programming and erasing efficiency and performance.

7 Claims, 8 Drawing Sheets

| Operation Status | Control gate | Source(12) | Drain(13) | Substrate(11) |
|---|---|---|---|---|
| Discharge(Erase) | 12V | 0V | 0V | 0V |
| Charge (Program) | 1.5V | 9V | 0.5V | 0V |
| Read | 1.8V | 0V | 0.8V | 0V | ical view of a conven-
METHODS OF FORMING SPLIT-GATE NON-VOLATILE MEMORY DEVICES

CROSS-REFERENCE TO RELATED APPLICATION

This application claims priority to Korean Patent Application No.2005-0018771, filed on Mar. 7, 2005, which is incorporated herein by reference.

TECHNICAL FIELD OF THE INVENTION

The present invention relates generally to non-volatile memory devices and methods for fabricating non-volatile memory devices. More specifically, the present invention relates to split gate memory devices having frameworks that provide increased floating gate coupling ratios, thereby enabling enhanced programming and erasing efficiency and performance.

BACKGROUND

In general, non-volatile memory devices are memory devices that will retain stored data even while power is off. Typically, non-volatile memory devices are utilized in various products and devices, such as mobile telecommunication devices, memory cards, smart cards, and other devices and applications where power is not-always available, frequently interrupted and/or when lower power usage is required. In general, non-volatile memory devices include, for example, EPROM (Erasable and Programmable Read Only Memory) devices, EEPROM (Electrically Erasable and Programmable Read Only Memory) devices, SRAM and Flash Memory. More specifically, one type of non-volatile memory is known as split-gate, floating gate, EEPROM memory devices. These split-gate transistor memory devices are typically employed in various applications, particularly embedded systems, as such memory devices afford low cost, in system re-programmable, and highly reliable non-volatile memory solutions.

FIG. 1A illustrates a cross-sectional view of a conventional non-volatile split-gate memory device (10). In particular, FIG. 1A depicts a pair of split-gate memory cells M1 and M2 formed on a p-type semiconductor substrate layer (11). A plurality of n-type diffusion regions (12) and (13) are formed in the substrate (11). The diffusion region (12) is a common source region (12) that is shared by cells M1 and M2, and the diffusion regions (13) are drain regions. The memory cells M1 and M2 have mirror image structures with respect to the common source region (12). In particular, each cell M1, M2 comprises a channel region (14) between the common source region (12) and drain regions (13), a floating gate (15), a control gate (16), a gate insulation layer (17), a polyoxide layer (18) formed on the floating gate (15), and a tunnel insulating layer (19).

The floating gate (15) is an electrically isolated gate electrode, which is formed to overlap a portion of the channel region (14) and a portion of the common source region (12). The control gate (16) is formed to overlap a portion of the channel (14) adjacent the drain region (13), as well as overlap a sidewall and upper portion of the floating gate (15). The gate insulating layer (17) is formed over the substrate (11) to insulate the floating gate (15) and control gate (16) from the substrate (11). The polyoxide layer (18) is formed on the floating gate (15) by a local oxidation of silicon (LOCOS) process. The tunnel insulating layer (19) is disposed between the floating gate (15) and control gate (16), and covers one sidewall of the floating gate (15) and a portion of the channel region (14).

In one conventional design, each control gate (16) is a word line that extends in a row direction (orthogonal to the plane of the drawing page) and commonly connected to each memory cell along the rows. An interlayer dielectric layer (20) is formed over the memory cells M1, M2. A common source line (22) is patterned from a $1^{st}$ level metallization layer and connected to the common source region (12) by a contact plug (21). The common source line (22) extends in the same direction as the wordlines (or control gates (16)). The drain regions (13) are connected by a common bit line (not shown) that is formed from a second metallization layer and which extends orthogonal to the row direction. Each pair of rows that share a common source form a page.

In general, the memory cells M1 and M2 are set to logical "1" or "0" depending on the charge stored in the respective floating gate electrodes (15). In particular, the floating gates (15) are used to change the threshold voltage of the memory cell transistor such that depending on the charge stored on the floating gate (15), the memory cell transistor is either in a high threshold state (non-conducting state) or a low threshold state (conducting state), wherein the conducting or non-conducting state is output as the logic level during a read operation.

In effect, each memory cell transistor is formed of a series connected memory transistor and a read/select transistor, wherein the memory transistor is formed by the floating gate (15) and portion of the channel (14) adjacent to, and overlapped by, the floating gate (15), and wherein the read/select transistor is formed by the control gate (16) and portion of the channel (14) adjacent to, and overlapped by, the control gate (16). The current flow through the channel (14) is controlled by the combination of the memory and read/select transistors, wherein the floating gate (15) essentially operates as an ON/OFF switch for the select/read transistor depending on the logical state of the memory cell.

In particular, in a programmed state (high threshold state), an excess of electrons are stored on the floating gate electrode (15). The memory cells M1 and M2 are programmed to a high threshold voltage using a technique know as CHE (Channel Hot Electron) SSI (source side injection) to inject electrons flowing in the channel (14) into the floating gate (15) through the gate insulating layer (17). These hot channel injected electrons are trapped on the floating gate electrode (15) and create a net negative voltage on the floating gate (15), which results in an increase in the threshold voltage required to change the memory cell from a non-conducting to a conducting state. During a read operation, the negatively charged floating gate (15) opposes an electric field created by a positive voltage applied to the control gate (16) of the read/select transistor. In effect, a programmed memory cell is in a non-conducting state because source-drain current does not flow when normal read/select control voltages are applied to the control gate (16) during a read operation.

On the other hand, in a non-programmed state (low threshold state), the floating gates (15) are devoid of negative charge (as compared to the programmed state). In particular, during an erase process, electrons on the floating gate (15) are transferred to the control gate (16) through the tunnel oxide layer (19) using a technique known as Fowler-Nordheim (FN) tunneling. When the memory cell is erased, the floating gate (15) is discharged to have a net positive charge that allows the memory cell transistor to be turned "ON" or "OFF", depending on the voltage on the control gate (16). When the memory cell is erased, a positive voltage on the floating gate (15) causes the portion of the channel (14) under the floating gate (15) to become inverted. In the non-programmed state, however, current flow in the channel (14) will be controlled by the voltage applied to the control gate (16).

FIG. 1B is a table that illustrates conventional operating conditions for the memory cells M1 and M2 during erase, program, and read operations. In the conventional scheme depicted in FIG. 1B, a read voltage is set to 1.8 volts. The threshold voltage $V_{th}$ for an "ON" (low threshold/non-programmed) memory cell is within a range of about –0.5V to 0.8V, and the $V_{th}$ for an "OFF" (high threshold/programmed) memory cell is about 3.2V to about 4.7V.

FIG. 1B illustrates operating voltages for performing a read operation. During a read cycle, the read voltage of 1.8 V is applied to the control gate (16) (word line), 0V is applied to both the source (12) and substrate (11), and a voltage of 0.8V is applied to the drain region (13) (bit line). Under these conditions, if the selected memory cell is in the "high threshold" or "OFF" state, the memory transistor will not conduct. The lack of current flowing through the selected bit line will be detected and output as a logic "0". On the other hand, if the selected memory cell is in the "low threshold" or "ON" state, then the memory transistor will conduct. The current, flowing through the selected bit line, will be detected and output as a logic "1".

FIG. 1B illustrates the operating voltages for an erase process to discharge the floating gate (15). During an erase process, the drain (13), source (12) and substrate (11) are set to 0V and a predetermined voltage (12V or greater) is applied to the control gate (16). The high voltage on the control gate (16) creates a strong electric field that initiates FN tunneling, such that electrons in the floating gate (15) are transferred from the floating gate (15) to the control gate (16) through the tunnel insulating layer (19). During erasing, an strong electric field is concentrated at an acute region (15a) (see, FIG. 1A) formed at a rim of the floating gate (15), and the FN tunneling occurs at the vicinity of such acute region (15a). As negative charge is transferred from the floating gate (15) and positive charge accumulates on the floating gate (16), the FN tunneling mechanism will continue until there is insufficient voltage across the tunnel oxide (19) to sustain the FN tunneling mechanism. As noted above, the positive charge on the floating gate (15) places the memory cell into a "low threshold" state, allowing the cell to conduct during a read operation (and thus being read as a logical "1").

FIG. 1B further illustrates operating voltages for a program operation. As noted above, the memory cells M1, M2 are programmed by source side channel hot electron injection. During programming, a voltage of 1.5V is applied to the control gate (16), which is sufficient to activate the channel (14) under the control gate (16). Furthermore, a voltage of 0.5V is applied to the drain (13), a voltage of 0V is applied to the substrate (11), and a relatively large source voltage of 9V is applied to the source (12) via the source line (22). The source-to-drain voltage differential generates channel hot electrons. The source voltage is capacitively coupled to the floating gate (15) via capacitance C1, which creates an electric field between the floating gate (15) and the channel (14). As the electrons flow from the drain (13) to the source (12) and gain kinetic energy, the path of such electrons is altered by the electric field between the floating gate and substrate. Those electrons with sufficient energy to overcome the substrate-gate oxide (Si—SiO2) barrier will accelerate from the channel (14) toward the floating gate electrode (15) through the gate oxide (17), and be trapped on the floating gate electrode (15). As negative charge accumulates on the floating gate (15), the positive charge generated during an erasing process is neutralized, and the hot channel electron injection will continue until there is insufficient voltage differential to sustain the injection mechanism. As noted above, the negative charge on the floating gate (15) places the memory cell into a "high threshold" state, preventing the cell to conduct during a read operation (and thus being read as a logical "0").

Although the conventional split-gate memory framework of FIG. 1A provides advantages over other conventional non-volatile memory designs, the split-gate framework of FIG. 1A can suffer performance problems with respect to data retention and cycling endurance. For instance, as noted above, an erase operation requires application of a high-voltage (e.g., 12V or greater) to the control gate (16) to initiate tunneling through the tunneling oxide (19) from the floating gate (15) to the control gate (16). Over time, the continuous application of such high voltage to the control gate (16) can adversely affect and stress the dielectric material of the tunneling layer (19) causing defects that can lead to unpredictable device reliability, especially for thin tunneling oxide layers.

Moreover, with respect to programming, although source side hot channel injection is a highly efficient programming technique, the conventional split gate memory framework of FIG. 1A affords a relatively low degree of capacitive coupling between the source (12) and the floating gate (15). In particular, as depicted in FIG. 1A, the coupling ratio C1 is limited by the overlapping area between the common source (12) and the floating gate (15). An increased coupling ratio yields increased programming speed. In the conventional design, a relatively large source voltage of 9V must be applied to the source region to effectively increase the coupling ratio by increasing the lateral diffusion of the source region (12).

However, a large source voltage applied to the source region (12) can result punch-through and junction breakdown due an increase of a source depletion region (12a). Indeed, the increased lateral diffusion of the source depletion region (12a) can result in punch through near the source region (12) due to excessive current. As the conventional framework of FIG. 1A is scaled to smaller design rules, the ability to use large source voltages is limited as the required gap X1 margin decreases.

SUMMARY OF THE INVENTION

In general, exemplary embodiments of the invention include non-volatile memory devices and methods for fabricating non-volatile memory devices. More specifically, exemplary embodiments of the invention include split gate memory devices having frameworks that provide increased floating gate coupling ratios, thereby enabling enhanced programming and erasing efficiency and performance.

In one exemplary embodiment, a split-gate memory cell framework is provided for implementing non-volatile memory. A split-gate memory cell includes first and second diffusion regions formed in a semiconductor substrate. A floating gate electrode is formed on the semiconductor substrate between the first and second diffusion regions, wherein a first side of the floating gate electrode overlaps a portion of the first diffusion region. A control gate electrode is formed on the semiconductor substrate between a second side of the floating gate electrode and the second diffusion region. A tunneling dielectric layer is disposed between the control gate electrode and the second side of the floating gate electrode. A coupling gate electrode is formed on the first diffusion region in the semiconductor substrate and adjacent to the first side of the floating gate electrode. A coupling dielectric layer is disposed between the coupling gate electrode and the first side of the floating gate electrode, wherein a thickness of the coupling dielectric layer is less than a thickness of the tunneling dielectric layer.

In the exemplary split gate cell framework, the coupling gate yields an increased coupling ratio between the floating gate and common diffusion (e.g., source) region. The increased coupling ratio is obtained by the additional capacitive coupling in the area between a sidewall of the floating gate electrode and the coupling gate electrode.

In addition, the increased coupling between the floating gate and common source region enables a smaller voltage to be applied to the control gate (smaller than 12V) while generating an electric field across the tunneling layer which is strong enough to initiate FN tunneling from the floating gate to the control gate for an erase process.

These and other exemplary embodiments, aspects, objects, features and advantages of the present invention will become apparent from the following detailed description of exemplary embodiments, which is to be read in connection with the accompanying drawings.

DETAILED DESCRIPTION OF EXEMPLARY EMBODIMENTS

Figure 1A:
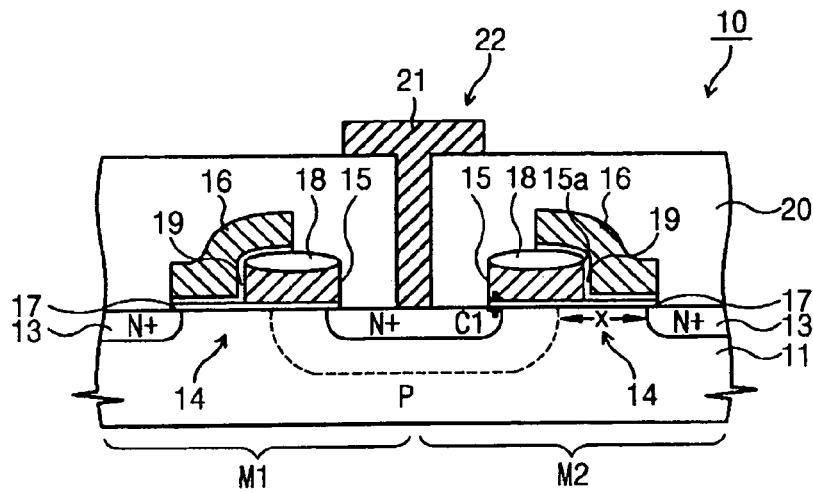
FIG. 1A is a cross-sectional schematic view of a conventional split gate non-volatile memory cell.
Figure 1B:
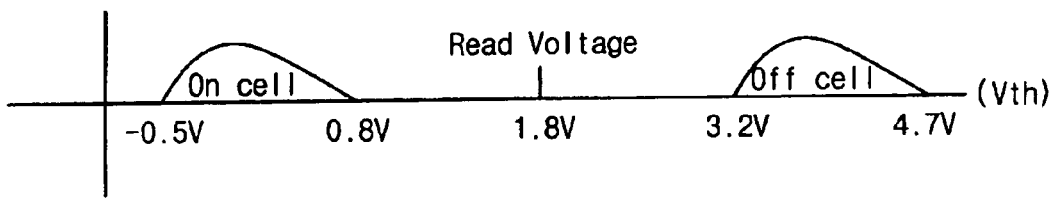
FIG. 1B is a table that illustrates operating conditions for the memory cell of FIG. 1A during an erase, program and read operation, according to the prior art.

Exemplary embodiments of the invention will now be described more fully with reference to the accompanying drawings in which it is to be understood that the thickness and dimensions of the layers and regions are exaggerated for clarity. It is to be further understood that when a layer is described as being "on" or "over" another layer or substrate, such layer may be directly on the other layer or substrate, or intervening layers may also be present. Moreover, similar reference numerals used throughout the drawings denote elements having the same or similar functions.

Figure 2:
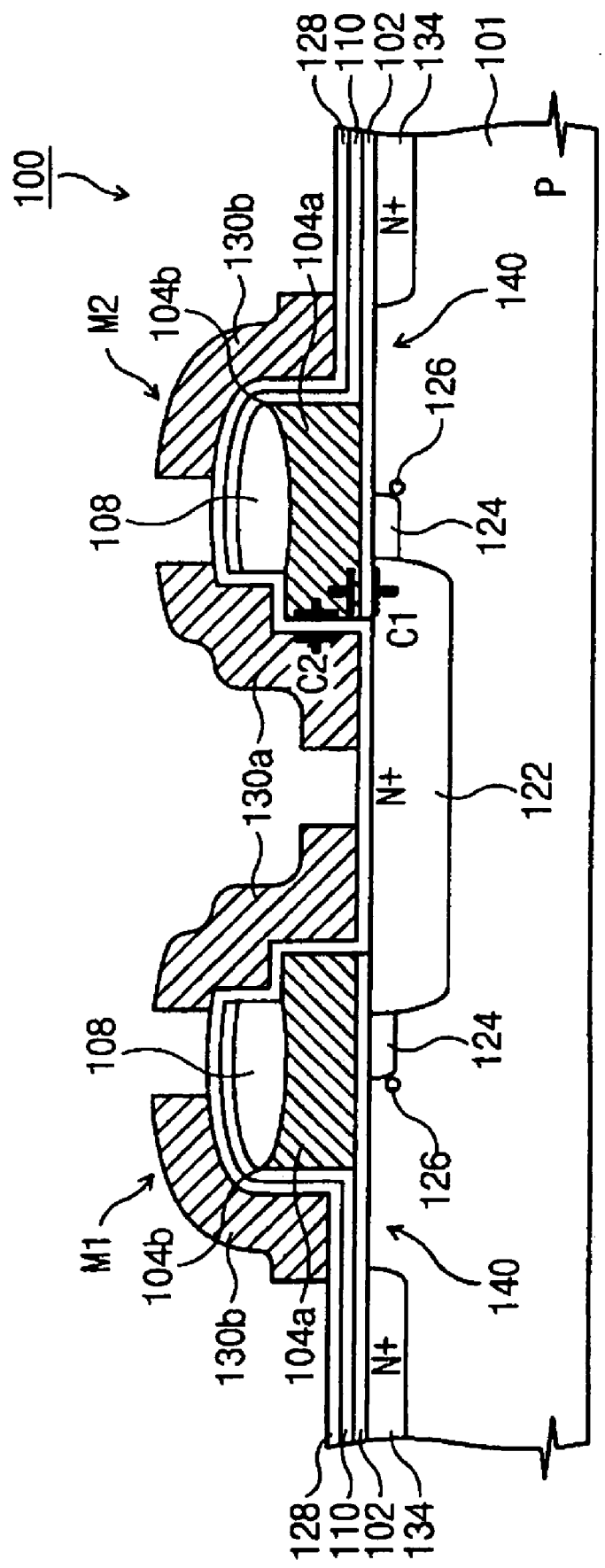
FIG. 2 is a cross-sectional schematic view of a split gate non-volatile memory cell according to an exemplary embodiment of the invention.

FIG. 2 is a cross-sectional schematic view of a split gate non-volatile memory device (100) according to an exemplary embodiment of the invention. In particular, FIG. 2 depicts two split-gate memory cells M1 and M2 formed on a p-type semiconductor substrate layer (101). A plurality of diffusion regions (122) and (134) are formed in the substrate (101). In particular, in one exemplary embodiment, the diffusion region (122) is a common source region (122) shared between the memory cells M1, M2, and the diffusion regions (134) are drain regions. In other exemplary embodiments of the invention, a lightly doped source region (124) and halo region (126) may be formed, which enhance the hot channel injection during programming and limits over expansion of the depletion region thereby preventing punch through.

The memory cells M1 and M2 have mirror image structures with respect to the common source region (122). In particular, each cell M1, M2 comprises a channel region (140) formed between the common source region (122) and the drain regions (134), a floating gate (104a), a control gate (130b), a coupling gate (130b), a gate insulation layer (102), a polyoxide layer (108), and first and second dielectric layers (110) and (128).

The floating gate (104a) is an electrically isolated gate electrode, which is formed to overlap a portion of the channel region (140) and a portion of the common source region (122). The control gate (130b) is formed to overlap a portion of the channel (140) adjacent the drain region (134), as well as overlap a sidewall and upper portion of the floating gate (104a). The gate insulating layer (102) is formed over the substrate (101) to insulate the floating gate (104a), coupling gate (130a) and control gate (130b) from the substrate (101). The polyoxide layer (108) is formed on the floating gate (104a) by a local oxidation of silicon (LOCOS) process.

The coupling gate electrode (130a) and control gate electrode (130b) are disposed on opposite sides of the floating gate electrode (104a). In particular, the coupling gate electrode (130a) is formed on the source region (122) and adjacent to the first side of the floating gate electrode (104a). The control gate electrode (130b) is formed between a second side of the floating gate electrode (104b) and the drain region (134).

A tunneling dielectric layer is formed by the first and second dielectric layers (110) and (128) is disposed between the control gate electrode (130b) and the second side of the floating gate electrode (104a). A coupling dielectric layer is formed by the second dielectric layer (128) and is disposed between the coupling gate electrode (130a) and the first side of the floating gate electrode (104a). In the exemplary embodiment of FIG. 2, the coupling dielectric layer formed by the second dielectric layer (128) is thinner than the tunneling dielectric layer formed by the first and second dielectric layers (110) and (128).

The exemplary split gate memory framework of FIG. 2 provides various advantages and increased performance over the conventional framework of FIG. 1A. For instance, in the split-gate memory framework of FIG. 2, the use of the coupling gate (130a) provides an increased coupling ratio between the floating gate (104a) and common source (122) region. The increased coupling ratio is obtained by the additional capacitive coupling C2 in the area between the sidewall of the floating gate electrode (104a) and the coupling gate (130b). Indeed, in FIG. 2, the coupling ratio to the floating gate (104a) is C1+C2, which is greater than the coupling ratio C1 of FIG. 1A.

The increased coupling ratio (C1+C2) allows a smaller source voltage to be applied to the source region (122) during a programming process without reduction is programming efficiency or programming speed. Furthermore, as compared to the conventional design, application of a smaller source voltage to the source region (122) result in a reduction is the size of the depletion region that is formed from the source region, thus reducing possibility of punch through and junction break-down of source region.

It is to be further appreciated that the exemplary split gate framework of FIG. 2 provides increased performance and reliability with regard to erasing using FN tunneling. For instance, the increased coupling between the floating gate (104a) and source region (122) (where source voltage is held at 0V) enables a smaller voltage to be applied to the control gate (130b) (smaller than 12V) while generating an electric field across the tunneling layers (110) and (128), which is strong enough to initiate FN tunneling from the floating gate (104a) to the control gate (130b) at the acute region (104b).

Furthermore, as compared to the conventional design, the exemplary memory framework of FIG. 2 provides a relatively thicker tunneling oxide layer (stacked layers 110 and 128) as compared to the thinner coupling oxide layer (layer 128), which results in lower capacitive coupling between the floating gate electrode (104a) and control gate (130b) during the erase process. The increased coupling between the source region (123) and floating gate (104a) together with the decreased capacitive coupling between the floating gate (104a) and the control gate (130b), allows smaller erase voltages to be applied to the control electrode (130b) while providing increased erase efficiency.

Moreover, the use of a thicker tunneling oxide (layers 110 and 128) provides a high-energy barrier to electron leaking from the floating gate, thus increasing data retention performance. In addition, the thicker tunneling layer reduces susceptibility of the tunneling oxide from defects and damage that can occur from the repeated stress of high electric fields applied across the tunneling layer, thereby extending the cycling capability and reliability of the split gate memory device.

Figure 3A:
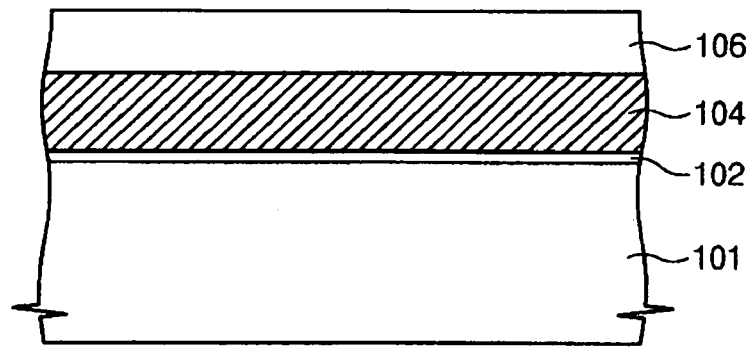
FIGS. 3A-3H are cross-sectional schematic views of the split-gate memory cell of FIG. 2 at various stages of a method for fabricating the split-gate non-volatile memory cell, according to an exemplary embodiment of the invention.

FIGS. 3A through 3I are cross-sectional views illustrating a method for fabricating a split gate memory device of FIG. 2, according to an exemplary embodiment of the invention. Referring initially to FIG. 3A, a gate insulation layer (102) and a polysilicon layer (104) are formed on a semiconductor substrate layer (101). In one exemplary embodiment, the substrate layer (101) is of p-type conductivity. The gate insulation layer (102) can be formed using conventional techniques. For instance, the gate insulation layer (102) can be a silicon oxide layer (SiO2) that is grown using a thermal oxidation process. In one exemplary embodiment of the invention, the gate insulation layer (102) is formed having a thickness in a range of about 70 angstroms to about 100 angstroms.

The polysilicon layer (104) is patterned to form floating gate electrodes. The polysilicon layer (104) can be formed using known techniques such as CVD (chemical vapor deposition). In one exemplary embodiment, the polysilicon layer (104) is formed having a thickness in a range of about 1000 angstroms to about 2500 angstroms.

Figure 3B:
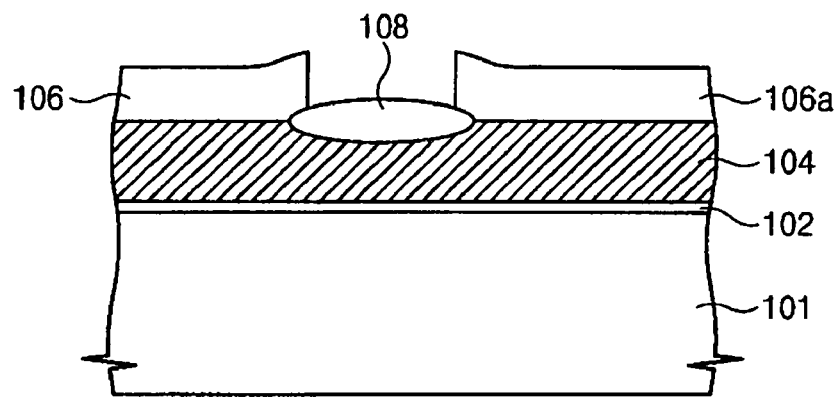

Referring to FIG. 3B, a polyoxide layer (108) is formed on the polysilicon layer (104) using known techniques. For instance, starting from the structure depicted in FIG. 3A, a nitride layer (106) (SiN) is formed over the polysilicon layer (104) using CVD. A photoresist pattern is formed over the nitride layer (106) using conventional methods. The photoresist pattern is used as a mask to etch exposed portions of the nitride layer (106) down to the polysilicon layer (104) to form a nitride mask (106a). The photoresist pattern is then removed and the nitride mask pattern (106) is used during a thermal oxidation process to form polyoxide layer (108) regions of the polysilicon layer (104) exposed by the nitride mask (106a).

Figure 3C:
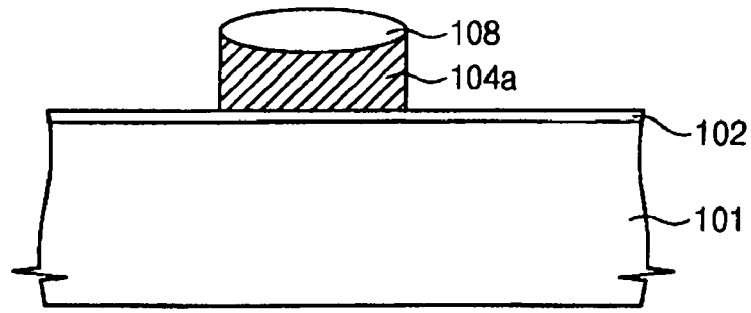

Referring to FIG. 3C, the nitride mask (106a) is removed (e.g., etched using phosphoric acid). An etch process is then performed to selectively etch the polysilicon layer (104) using the polyoxide layer (108) as an etch mask, to thereby form a floating gate (104a).

Figure 3D:
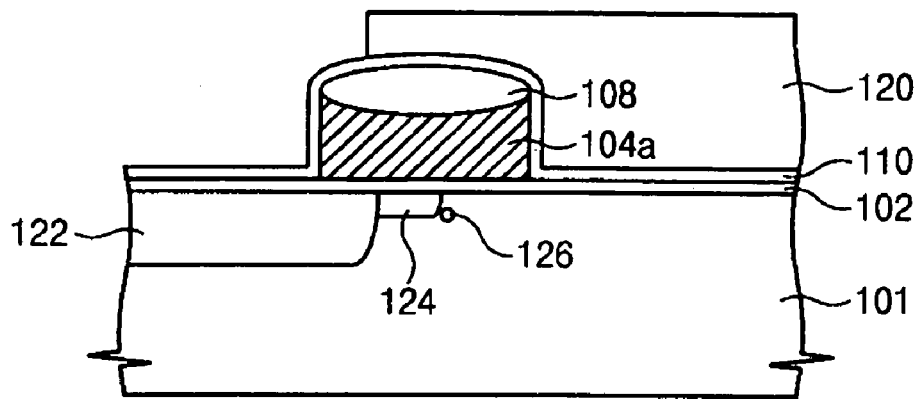

Referring to FIG. 3D, a conformal first dielectric layer (110) is formed using known techniques. For instance, in one exemplary embodiment, the first dielectric layer (110) is a conformal silicon oxide layer that is formed using MTO, HTO or CVD. The first dielectric layer (110) is formed having a thickness in a range of about 50 angstroms to about 200 angstroms. In one preferred embodiment, the first dielectric layer (110) is formed to a thickness of about 70 angstroms.

Thereafter, a nitride mask pattern (120) is formed using known techniques. For instance, the mask pattern (120) may formed of by depositing a layer of silicon nitride using CVD and etching the silicon nitride to form the nitride mask (120). The nitride mask (120) is used as a mask for ion implantation processes to form a highly doped source region (122), lightly doped source region (124) and halo region (126). In one exemplary embodiment, the highly doped source region (122) is an N+ region that is formed by implanting phosphorus PH dopants at an implant energy in a range of about 25~40 Kev and concentration of about $1\times10^{15}$~$5\times10^{15}$, or by implanting arsenic AS dopants at an implant energy in a range of about 2~40 Kev and concentration of about $2\times10^{15}$~$4\times10^{15}$. The lightly doped region (124) is an N− region that is formed by implanting arsenic AS dopants at an implant energy in a range of about 20~30 Kev and concentration of about $5\times10^{12}$~$9\times10^{12}$. Moreover, the halo region (126) is a P+ region that is formed by angle implanting Boron B dopants at an angle of about 30 degrees, an implant energy in a range of about 20~40 Kev and a concentration of about $1\times10^{12}$~$9\times10^{12}$.

Figure 3E:
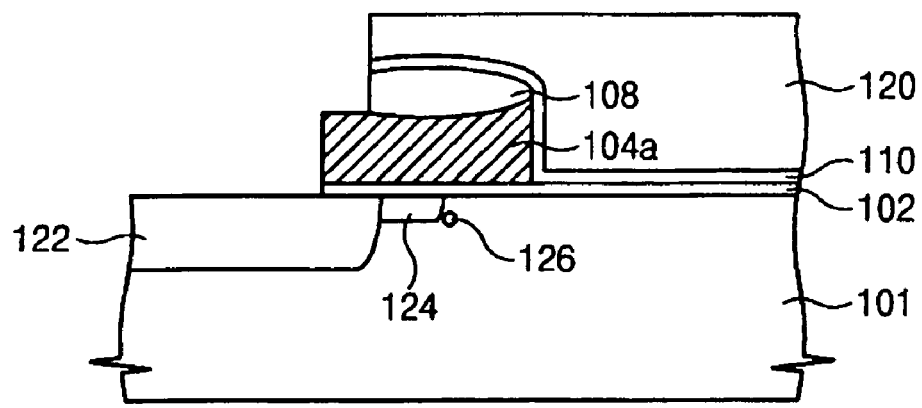

Referring to FIG. 3E, the nitride mask (120) is used as an etch mask during an etch process to remove exposed portions of the first dielectric layer (110), polyoxide layer (108) and gate insulating layer (102). This process results in exposing a side portion of the floating gate (104a) adjacent the source region (122) and blunting the exposed edge portion of the floating gate electrode (104a).

Figure 3F:
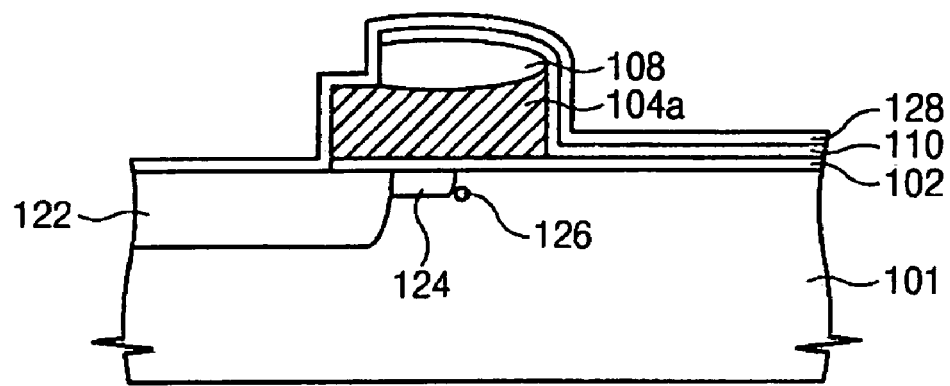

Referring to FIG. 3F, the nitride mask (120) is removed using phosphoric acid. Then, a conformal second dielectric layer (128) is formed using known techniques. For instance, in one exemplary embodiment, the second dielectric layer (128) is a conformal silicon oxide layer that is formed using MTO, HDP, HTO or CVD. The second dielectric layer (128) is formed having a thickness in a range of about 40 angstroms to about 100 angstroms.

Figure 3G:
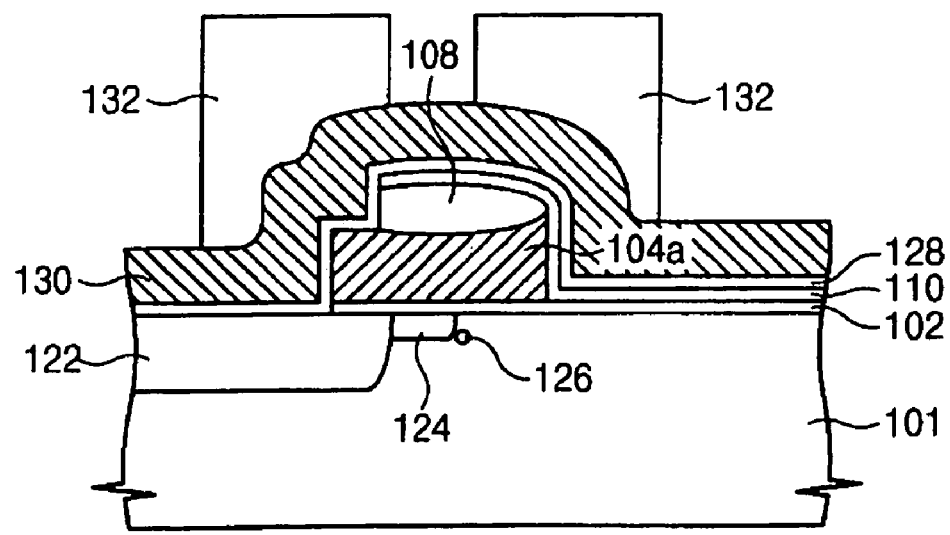

Referring to FIG. 3G, a conductive layer (130) is conformally formed using known techniques. The conductive layer (130) may be formed of polysilicon, tungsten, tungsten silicide, etc. The conductive layer (130) is patterned to form control and coupling gates. In particular, a photoresist mask (132) is formed over the conductive layer (130) to expose desired regions of the conductive layer (130).

Figure 3H:
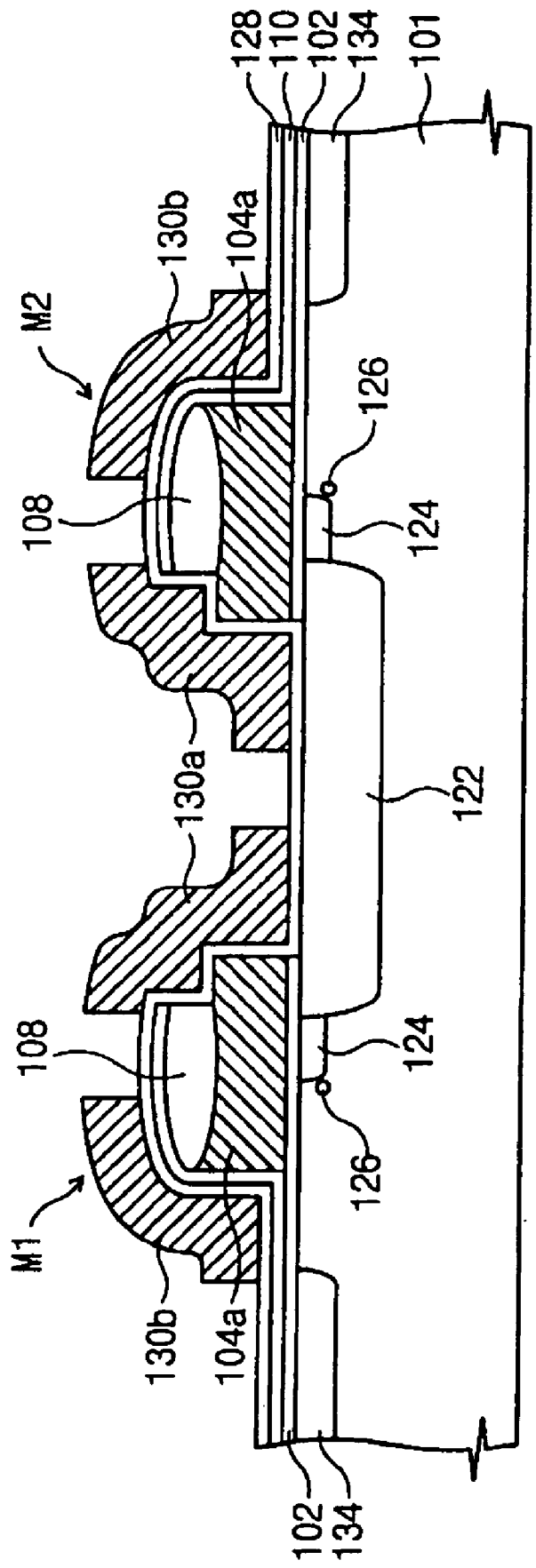

Referring to FIG. 3H, an etch process is performed to etch exposed portions of the conductive layer (130) to form coupling gates (130a) and control gates (130b). Thereafter, drain regions (134) are formed by ion implantation using known methods. In one exemplary embodiment of the invention as depicted in FIG. 3H, the conductive layer (130) can be etched such that coupling gates (130a) between adjacent cell pairs M1 and M2 are separate.

Figure 4:
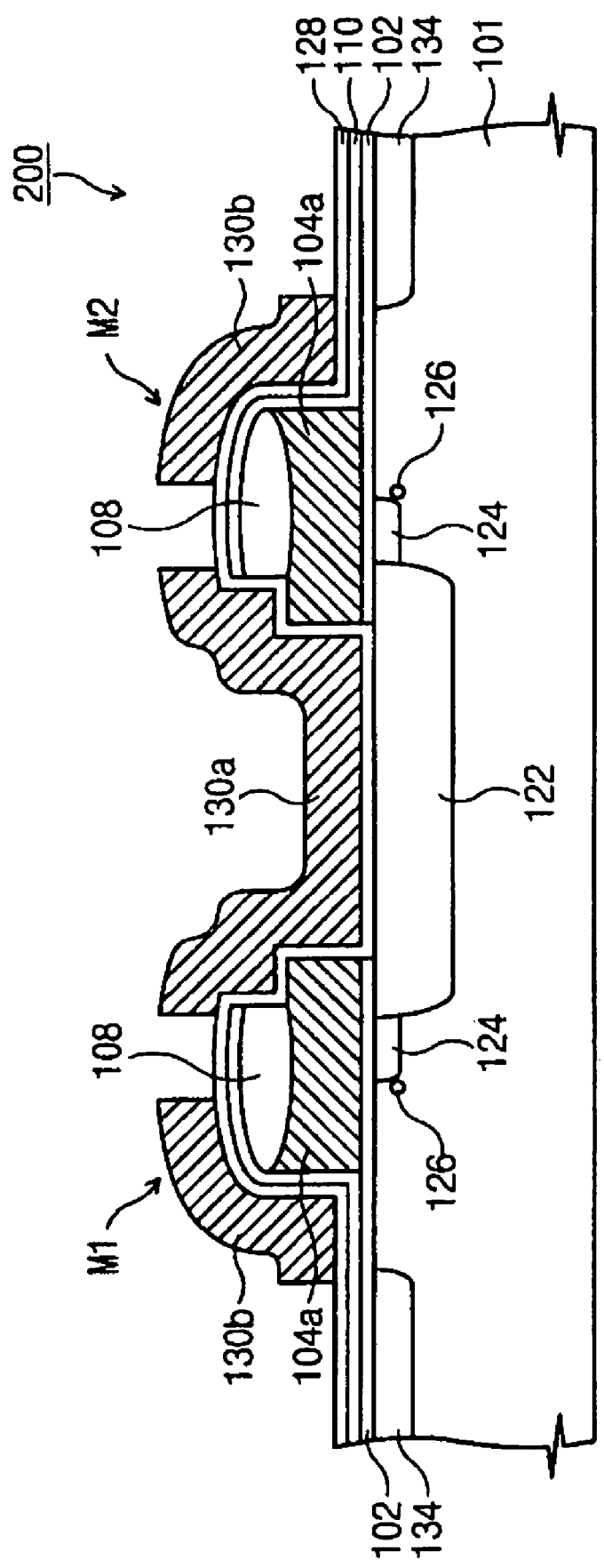
FIG. 4 is a cross-sectional schematic view of a split gate non-volatile memory cell according to another exemplary embodiment of the invention.

FIG. 4 is a cross-sectional schematic view of a split gate non-volatile memory device (200) according to an exemplary embodiment of the invention. The exemplary split gate non-volatile memory device (200) is similar to split gate non-volatile memory device (100) of FIGS. 2 and 3H, except that coupling gates (130a) between adjacent cell pairs M1 and M2 are connected. The memory device (200) can be fabricated using methods that are the same or similar to those described above with reference to FIGS. 3A-3G. However, in FIG. 3G, the mask (132) is formed such that the conductive layer (130) disposed over the source region (122) is not etched between the cells M1 and M2. In the exemplary embodiments of FIGS. 3H and 4, the coupling gates (130a) can be electrically connected or electrically isolated from the source region (122).

Figure 5:
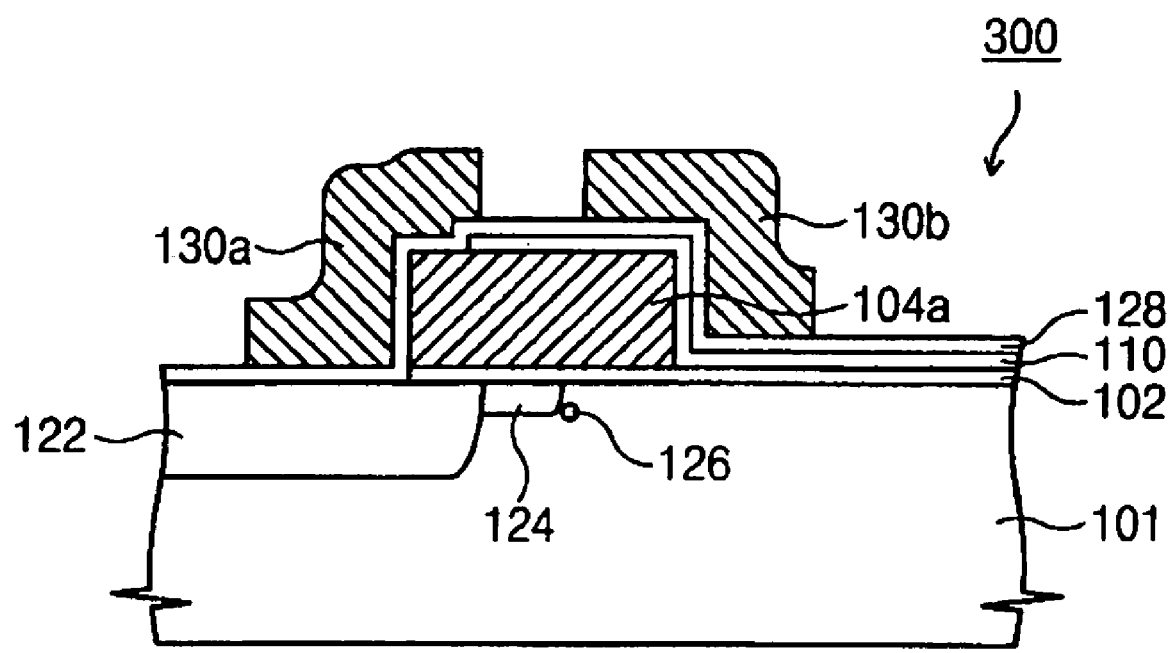
FIG. 5 is a cross-sectional schematic view of a split gate non-volatile memory cell according to another exemplary embodiment of the invention.

FIG. 5 is a cross-sectional schematic view of a split gate non-volatile memory device (300) according to an exemplary embodiment of the invention. The exemplary split gate non-volatile memory device (300) is similar to the split gate non-volatile memory devices (100) and (200), except that a polyoxide layer (108) in FIGS. 2, 3H, 4) are not formed, which results in the surface of the floating gate (104a) being flat.

Although exemplary embodiments have been described herein with reference to the accompanying drawings, it is to be understood that the invention is not limited to the exemplary embodiments described herein, and that various other changes and modifications may be readily envisioned by one of ordinary skill in the art without departing form the scope or spirit of the invention. All such changes and modifications are intended to be included within the scope of the invention as defined by the appended claims.

We claim:

1. A method for fabricating a split-gate memory cell array, comprising:

forming a floating gate electrode on a semiconductor substrate;

forming a first conformal dielectric layer on the floating gate electrode and semiconductor substrate;

forming a first diffusion region in the semiconductor substrate adjacent a first side of the floating gate electrode, wherein the first diffusion region is formed such that a first side of the floating gate electrode overlaps the first diffusion region;

removing a portion of the first conformal dielectric layer that is disposed on the first side of the floating gate electrode and the first diffusion region;

forming a second conformal dielectric layer on the floating gate electrode and semiconductor substrate;

forming a conformal conductive layer over the second conformal dielectric layer on the semiconductor substrate; and patterning the conformal conductive layer to form a coupling gate electrode on the first side of the floating gate electrode and to form a control gate electrode on a second side of the floating gate electrode; and forming a second diffusion region in the semiconductor substrate adjacent the control gate electrode.

2. The method of claim 1, wherein forming a floating gate electrode comprises:

forming a polysilicon layer on the semiconductor substrate;

forming a nitride layer on the polysilicon layer;

patterning the nitride layer to expose a portion of the polysilicon layer;

forming an oxide layer on the exposed portion of the polysilicon layer;

patterning the polysilicon by using the oxide layer as a mask.

3. The method of claim 2, wherein forming an oxide layer comprises forming the floating gate electrode to have a tip-shape structure on each end portion of the upper surface thereof.

4. The method of claim 1, wherein forming the first diffusion region comprises forming a lightly doped diffusion region and a heavily doped diffusion region.

5. The method of claim 4, further comprising forming a third diffusion region surrounding the lightly doped diffusion region.

6. The method of claim 1, wherein the first conformal dielectric layer is formed to have a thickness in a range of about 50 angstroms to about 200 angstroms.

7. The method of claim 1, wherein the second conformal dielectric layer is formed to have a thickness in a range of about 40 angstroms to about 100 angstroms.

* * * * *